United States Patent
MacDonald et al.

(10) Patent No.: US 10,417,104 B2
(45) Date of Patent: Sep. 17, 2019

(54) DATA PROCESSING SYSTEM WITH BUILT-IN SELF-TEST AND METHOD THEREFOR

(71) Applicant: FREESCALE SEMICONDUCTOR, INC., Austin, TX (US)

(72) Inventors: Colin MacDonald, Austin, TX (US); Alexander B. Hoefler, Austin, TX (US); Jose A. Lyon, Austin, TX (US); Chris P. Nappi, Austin, TX (US); Andrew H. Payne, Austin, TX (US)

(73) Assignee: NXP USA, INC., Austin, TX (US)

( * ) Notice: Subject to any disclaimer, the term of this patent is extended or adjusted under 35 U.S.C. 154(b) by 38 days.

(21) Appl. No.: 14/861,108

(22) Filed: Sep. 22, 2015

(65) Prior Publication Data

US 2017/0082686 A1    Mar. 23, 2017

(51) Int. Cl.
*G06F 11/27* (2006.01)
*G01R 31/3185* (2006.01)

(52) U.S. Cl.
CPC ...... *G06F 11/27* (2013.01); *G01R 31/318544* (2013.01)

(58) Field of Classification Search
CPC .......................... G01R 31/3177; G06F 11/27
See application file for complete search history.

(56) References Cited

U.S. PATENT DOCUMENTS

| | | | |
|---|---|---|---|
| 5,260,950 A | 11/1993 | Simpson et al. | |
| 5,574,731 A * | 11/1996 | Qureshi | G01R 31/318541 714/726 |
| 8,222,943 B2 | 7/2012 | Sood et al. | |
| 2004/0111658 A1* | 6/2004 | Natsume | G01R 31/3172 714/752 |
| 2004/0224443 A1* | 11/2004 | Wang | G06F 1/10 438/128 |
| 2006/0066357 A1* | 3/2006 | Inoue | G01R 31/318583 326/93 |
| 2007/0094629 A1 | 4/2007 | Alter et al. | |
| 2011/0231719 A1* | 9/2011 | Kim | G01R 31/318533 714/729 |

* cited by examiner

*Primary Examiner* — April Y Blair
*Assistant Examiner* — Rong Tang

(57) ABSTRACT

A scan circuit and methods of operating a scan circuit are provided. The method for operating a scan circuit includes providing a first scan flip-flop which includes an overwrite feature. With the overwrite feature enabled, a change in functional behavior of the first scan flip-flop occurs based on a control signal. The method may further include capturing data at a first input of the first scan flip-flop during a first state of the control signal and resetting captured data by using the overwrite feature during a first transition of the control signal. The method may further include forming a scan chain with one or more of the first scan flip-flops and one or more second scan flip-flops. The second scan flip-flops may include a similar overwrite feature, having the overwrite feature disabled.

16 Claims, 5 Drawing Sheets

DATA PROCESSING SYSTEM WITH BUILT-IN SELF-TEST AND METHOD THEREFOR

BACKGROUND

Field

This disclosure relates generally to data processing, and more specifically, to a data processing system with built-in self-test (BIST) and method therefor.

Related Art

Logic built-in self-test (LBIST) is a type of BIST that has the testing hardware and software built into an integrated circuit (IC) being tested so that an expensive and sophisticated external tester is not needed. Like BIST, LBIST uses a scan chain of series-connected flip-flops for testing. Test data is generated in the IC and output data from the scan chain is compared with expected output data. Unexpected results from the test data input and output comparisons are used to locate problems in the IC.

For various reasons, sometimes the unexpected results from scan chain comparisons may not be an indication of a problem with the function of the IC. For example, an IC may have problems that cause the scan chain to capture an unexpected value even though normal function of the integrated circuit operates correctly. The problems may include timing problems, incorrect device modeling, or use of a poor coding style when designing the IC. These unexpected results may cause flip-flops in a scan chain to capture the unexpected value without creating an error in the function of the IC. However, the captured unexpected values may cause scan chain output comparisons to fail, leading to LBIST failure.

Fixing the problem of scan chain errors can be costly. For example, applying an engineering change order (ECO) fix may require multiple mask layers to be changed. At advanced process nodes, such as below 55 nanometers (nm), each metal layer mask may cost $125,000 or more. To avoid the cost of modifying mask layers, one or more scan chains on an IC may be disabled so that LBIST will not run for the disabled scan chain. This will significantly reduce test coverage of the IC.

Therefore, a need exists for a way to correct faulty scan chains with only a small impact to the IC design and cost, and require minimal changes to metal layers while maintaining good test coverage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
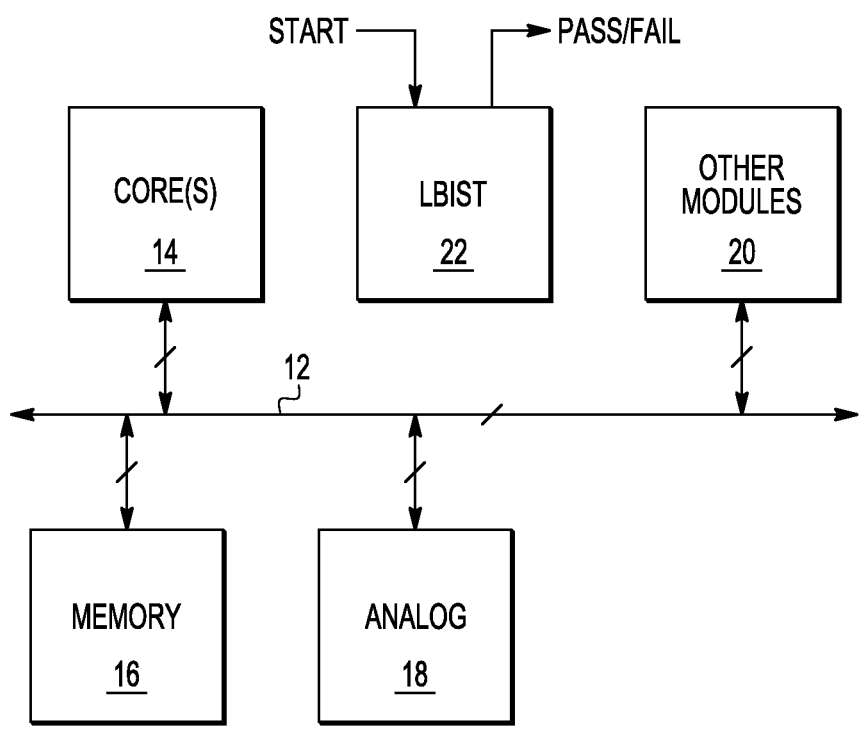
FIG. 1 illustrates, in block diagram form, a data processing system having LBIST in accordance with an embodiment.

Generally, there is provided, an LBIST system for an integrated circuit that includes a modifiable flip-flop for a scan chain. In one embodiment, the modifiable flip-flop is modified using a metal mask option. In an IC where the scan chain is capturing unexpected, or wrongly captured, values, the specific modifiable flip-flops that are capturing and storing the unexpected values are modified so that a substitute correct value is output instead of the unexpected value during a scan shift operation. The flip-flops not capturing unexpected values remain unmodified. In one embodiment, the modifiable flip-flop will reset to one value before it is modified. After modification, the modifiable flip-flop will be resettable to a different value at the beginning of a scan-shift mode, thus correcting the unexpected value. Sometimes the different value may not correct the unexpected value, but is used because it is a stable value. In the case where the new different value from the modified flip-flop cannot be modified to an expected value, the new different value is an unexpected value that is stable. The new stable unexpected value may require that the BIST signature be modified to achieve a pass with the new different value. A mask option during manufacturing may be used to provide the modification to subsequently manufactured integrated circuits having the modifiable flip-flops. The modification fixes the problem of an unexpected value with small impact on the design and cost using only a one metal layer change while still maintaining relatively good LBIST coverage.

In one embodiment, there is provided, a method for operating a scan circuit, the method comprising: providing a first scan flip-flop including an overwrite feature, the overwrite feature being enabled; capturing data at a first input of the first scan flip-flop during a first state of a control signal; and using the overwrite feature to overwrite a logic value at an output of the first scan flip-flop based on the control signal. Using the overwrite feature to overwrite a logic value at an output of the first scan flip-flop based on the control signal may also include using the overwrite feature to reset captured data during a first transition of the control signal. The method may further comprise performing a shift operation using data at a second input of the first scan flip-flop during a second state of the control signal. Resetting captured data may include resetting captured unexpected data. The first transition of the control signal may be a low-to-high logic value transition of the control signal. The method may further comprise providing a second scan flip-flop including the overwrite feature, the overwrite feature being disabled. The method may further comprise forming a scan chain including one or more of the first scan flip-flop and one or more of the second flip-flop. The method may further comprise coupling built-in self-test logic to the scan chain. The overwrite feature may be enabled by changing a photomask. The control signal may be characterized as a test enable signal or a scan enable signal.

In another embodiment, there is provided, a method for operating a scan circuit, the method comprising: providing a first scan flip-flop including an overwrite feature, the overwrite feature being enabled; capturing data at a first input of the first scan flip-flop based on a control signal during a capture phase; and overwriting captured data by using the overwrite feature based on the control signal during a shift phase. The method may further comprise providing a second scan flip-flop including the overwrite feature, the overwrite feature being disabled. The method may further comprise forming a scan chain including at least one of the first scan flip-flop and at least one of the second scan flip-flop. The method may further comprise performing a shift operation using data at a second input of the first scan flip-flop during a first state of the control signal. The overwrite feature may be enabled by changing a single metal layer.

In yet another embodiment, a scan circuit, comprises: a first scan flip-flop comprising: a first master-slave flip-flop having an input and an output; a first multiplexer having a first input coupled to the first master-slave flip-flop input during a first state of a select signal and a second input coupled to the first master-slave flip-flop input during a second state of the select signal; and a first internal overwrite circuit coupled to the first master-slave flip-flop, the first internal overwrite circuit being enabled; wherein data at a first input of the multiplexer is captured during a first state of the control signal, and wherein the captured data is overwritten by using the first internal overwrite circuit during a first transition of the control signal. The internal overwrite circuit may be enabled by changing a single photomask. The circuit may further comprise: a second scan flip-flop comprising: a second master-slave flip-flop having an input and an output; a second multiplexer having a first input coupled to the second master-slave flip-flop input during a first state of a select signal and a second input coupled to the second master-slave flip-flop input during a second state of the select signal; and a second internal overwrite circuit coupled to the second master-slave flip-flop, the second internal overwrite circuit being disabled; wherein the second internal overwrite circuit is similar to the first internal overwrite circuit. The circuit may further comprise a scan chain including at last one of the first scan flip-flop and at least one of the second scan flip-flop. The circuit may further comprise built-in self-test logic coupled to the scan chain.

FIG. 1 illustrates, in block diagram form, data processing system 10 in accordance with an embodiment. Data processing system 10 includes bus 12, processor core(s) 14, memory 16, analog circuits 18, other modules 20, and LBIST block 22. Core(s) 14, memory 16, analog circuits 18, and other modules 20 are all bi-directionally connected to bus 12. Bus 12 can be any type of bus for communicating any type of information such as data, address, or instructions. Core(s) 14 may be any type of processor such as a microprocessor (MPU), microcontroller (MCU), digital signal processor (DSP), or other type of processing core. There may be multiple processors like core(s) 14. Memory 16 may be any type of volatile or non-volatile memory, such as static random access memory (SRAM), dynamic random access memory (DRAM), flash, etc. Memory 16 may also be connected directly to core(s) 14. Analog circuits 18 includes analog circuits such as analog-to-digital converters, digital-to-analog converters, amplifiers, voltage regulators, etc. Other modules 20 can be any type of module for providing specific functionality depending on the intended application. Other modules 20 may predominately comprise logic such as AND, OR, NAND, NOR, exclusive OR, exclusive NOR, inverters and other types of logic gates. Other modules 20 may be implemented in logic, sometimes referred to as a sea-of-gates (SoG). In one embodiment, data processing system 10 is implemented on a single IC. LBIST 22 is a self-contained testing function where test patterns are generated on the IC. The test patterns are compared to scan out data from a scan chain. Any unexpected differences between the scan out data and the test patterns indicate a defect. The generation of unexpected test results may not be an indication of a genuine device problem. The unexpected test results may indicate device modeling inaccuracies, timing inaccuracies, failures dependent on temperature, intermittent failures, flip-flops with cascaded reset paths, etc. It may be time consuming and expensive to correct these types of problems that cause scan capture of unexpected values. Removing the affected scan chains may undesirably reduce test coverage of the IC.

Figure 2:
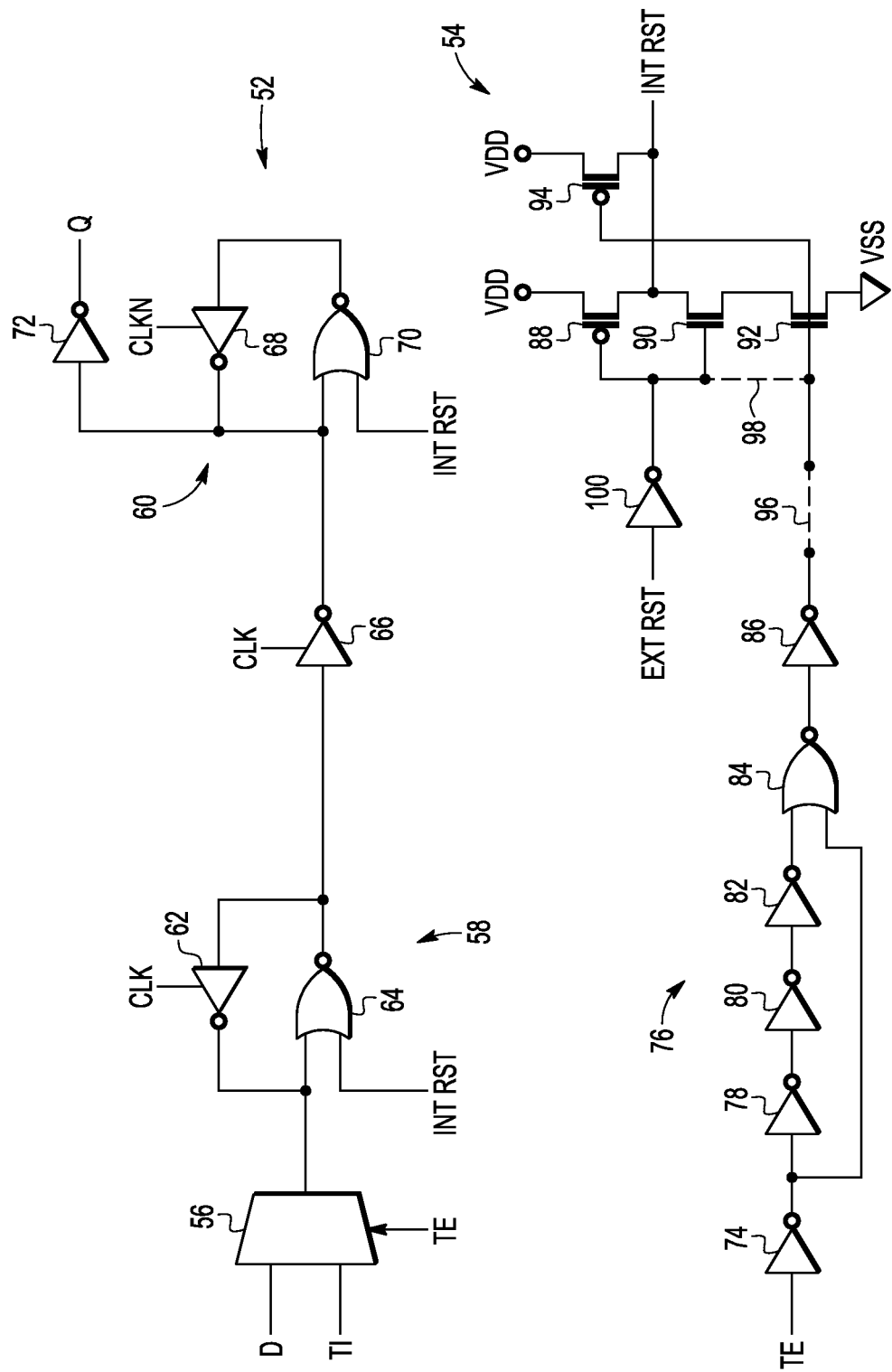
FIG. 2 illustrates a modifiable flip-flop of the data processing system of FIG. 1.

FIG. 2 illustrates a modifiable flip-flop 50 of data processing system 10 of FIG. 1 in accordance with an embodiment. Modifiable flip-flop 50 is a representative flip-flop for all of the flip-flops in data processing system 10 and may be found in any or all of the blocks illustrated in FIG. 1. There may be hundreds or thousands of flip-flops in an integrated circuit. Modifiable flip-flop 50 includes flip-flop portion 52 and reset portion 54. Flip-flop portion 52 includes multiplexer 56, master latch 58, slave latch 60, tristate inverter 66 and inverter 72. Master latch 58 includes tristate inverter 62 and NOR logic gate 64. Slave latch 60 includes tristate inverter 68 and NOR logic gate 70. Reset portion 54 includes inverters 74, 86 and 100, single-sided delay 76, P-channel transistors 88 and 94, and N-channel transistors 90 and 92. Single-sided delay 76 includes inverters 78, 80, and 82 and NOR logic gate 84.

In flip-flop portion 52, multiplexer 56 has a first input for receiving an input data signal labeled "D", a second input for receiving a test input signal labeled "TI", a control input for receiving a test enable signal labeled "TE", and an output. NOR logic gate 64 has a first input connected to the output of multiplexer 56, a second input for receiving an internal reset signal labeled "INT RST", and an output. Tristate inverter 62 has an input connected to the output of NOR logic gate 64, a control input for receiving a clock signal labeled "CLK" and an output connected to the first input of NOR logic gate 64. Tristate inverter 66 has an input connected to the output of NOR logic gate 64, a control input for receiving clock signal CLK, and an output. NOR logic gate 70 has a first input connected to the output of tristate inverter 66, a second input for receiving internal reset signal INT RST, and an output. Tristate inverter 68 has an input connected to the output of NOR logic gate 70, a control input for receiving a clock signal labeled "CLKN", and an output connected to the first input of NOR logic gate 70. Inverter 72 has an input connected to the output of inverter 66, and an output for providing an output data signal labeled "Q". Note that clock signal CLKN (clock bar) is a logical complement of clock signal CLK.

In reset portion 54, inverter 74 has an input for receiving test enable signal TE, and an output. Inverter 78 has an input connected to the output of inverter 74, and an output. Inverter 80 has an input connected to the output of inverter 78, and an output. Inverter 82 has an input connected to the output of inverter 80, and an output. NOR logic gate 84 has a first input connected to the output of inverter 82, a second input connected to the output of inverter 74, and an output. Inverter 86 has an input connected to the output on NOR logic gate 84, and an output. Inverter 100 has an input for receiving an external reset signal labeled "EXT RST", and output terminal. P-channel transistor 88 has a source connected to a power supply voltage terminal labeled "VDD", a gate connected to the output terminal of inverter 100, and a drain. N-channel transistor 90 has a drain connected to the drain of P-channel transistor 88, a gate connected to the gate of P-channel transistor 88, and a source. N-channel transistor 92 has a drain connected to the source of N-channel transistor 90, a gate, and a source connected to a power supply voltage terminal labeled "VSS". P-channel transistor 94 has a source connected to VDD, a gate connected to the gate of N-channel transistor 90, and a drain for providing internal reset INT RST. Alternate connections 96 and 98 are illustrated by a dashed line in FIG. 2.

The flip-flops of data processing system 10 can be connected together into one or more scan chains for testing. Reset portion 54 provides both a normal reset feature and an overwrite reset feature for flip-flop 50. In the illustrated embodiment, the normal reset feature is the default feature and is selected for all of the flip-flops in the integrated circuit by making connection 96 non-conductive and connection 98 conductive. If a fault is detected through LBIST testing that causes an unexpected value to be captured and stored in flip-flop portion 52, then the overwrite reset feature can be enabled and the normal reset feature disabled. In one embodiment, the overwrite reset feature can be enabled for subsequently manufactured integrated circuits by changing a mask for patterning connections 96 and 98 for the particular flip-flop capturing the unexpected value. In the illustrated embodiment, the overwrite feature causes a value stored in flip-flop portion 52 to be overwritten with a predetermined value so that the correct scan value is output from the flip-flop regardless of the value captured following a scan-shift operation. Reset portion 54 is just one embodiment of a circuit for resetting the output value of a flip-flop. In another embodiment, there may be other ways to output the correct value instead of overwriting the value stored in the flip-flop. For example, the master/slave flip-flop portion 52 may be bypassed and the correct value inserted at the output of the flip-flop using logic. The flip-flop can be allowed to store an unexpected value as long as the correct value is output.

Referring to FIG. 2, one of the reset features is enabled by making one of connections 96 and 98 conductive. One way to select one of the reset features for a flip-flop is by making a change to a photomask used during the manufacturing process for the integrated circuit. There are other ways to select between the features in other embodiments, such as for example, using a switch and control signal, or a fuse. Also, in other embodiments, the flip-flops may have complementary outputs instead of the single-ended output of the illustrated embodiment.

Figure 3:
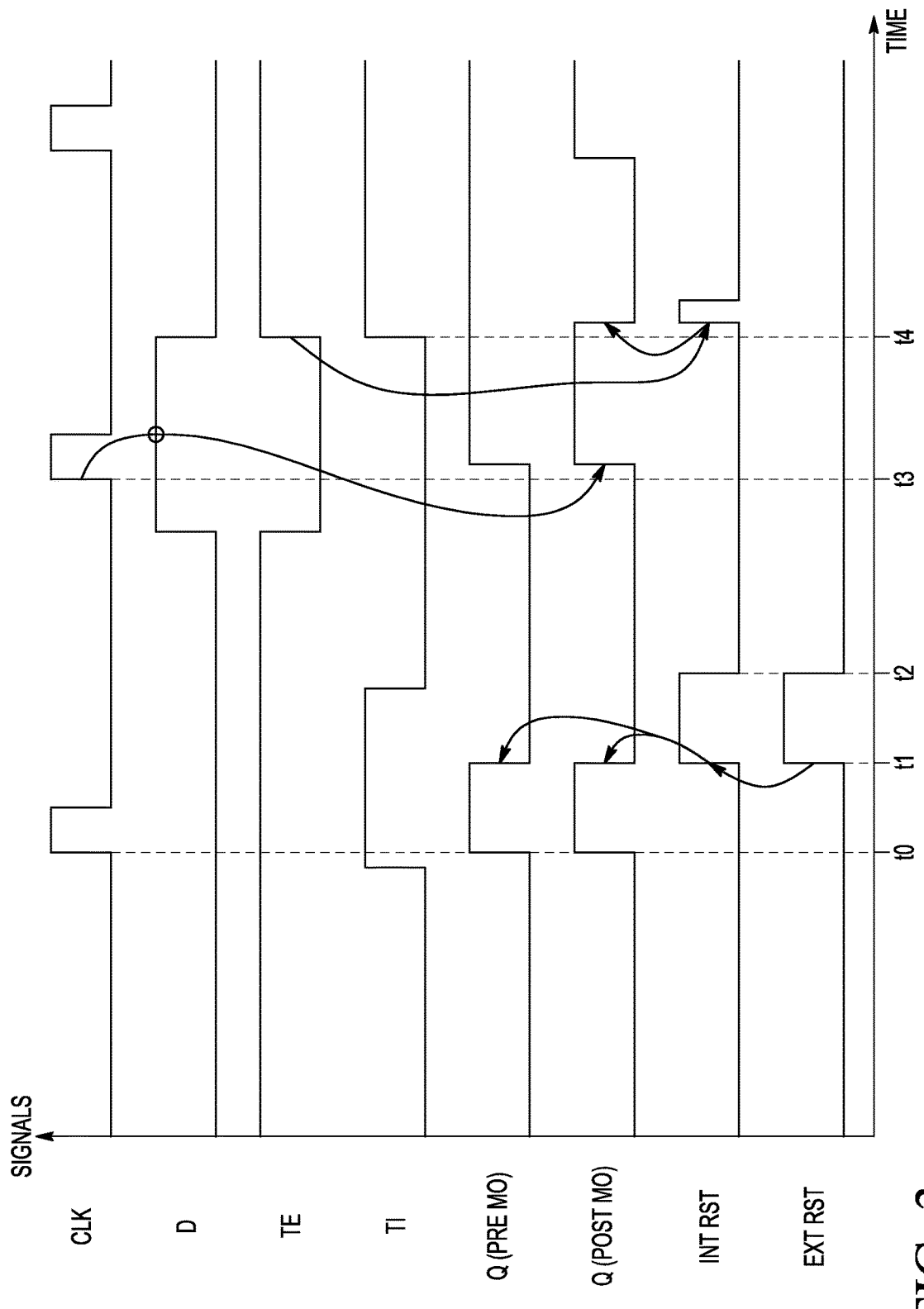
FIG. 3 illustrates a timing diagram of the operation of the flip-flop of FIG. 2.

FIG. 3 illustrates a timing diagram of various signals of flip-flop 50 of FIG. 2 used to show an LBIST operation of modifiable flip-flop 50 in a scan chain. Prior to time t0, test enable TE is a logic high, causing flip-flop 50 to be in scan-shift mode. In scan-shift mode the second input of multiplexer 56 is selected for receiving test input signal TI. By way of example, a logic high value of TI is scanned into the second input of multiplexer 56, beginning the scan-shift operation. At time t0, on a rising edge of clock signal CLK, a logic high output value Q is provided from the flip-flop. Output value Q is shown as a logic high for purposes of illustration. Output Q is shown for both a normal flip-flop without a metal option reset (PRE MO) and for a flip-flop after a metal option (POST MO) for the alternate reset. Generally, a test pattern comprising a combination of ones and zeros are scanned into a scan chain that includes modifiable flip-flop 50. An output data signal Q is then compared to expected data. Any comparisons that produce unexpected results indicate a problem with the circuit under test. At time t1, external reset signal EXT REST is asserted as a logic high. The internal reset signal INT RST is asserted as a logic high in response. The logic high internal reset INT RST is provided to the second inputs of NOR logic gates 64 and 70, causing both NOR logic gates to output a logic zero resulting in output signal Q transitioning to a logic zero. Just before time t3, input data signal D transitions to a logic high and test enable signal TE is negated by LBIST test logic (not shown) to a logic low. When test enable signal TE transitions low, flip-flop 50 begins scan capture mode. At time t3, on a rising edge of clock signal CLK, input data signal D is captured, as indicated by the circle of the waveform of signal D, and then a logic high data output signal Q (POST MO) and Q (PRE MO) is provided, depending on which of metal options 96 and 98 is implemented. At about time t4, data input signal D transitions to a logic low and test enable signal TE is asserted as a logic high, beginning another scan-shift operation. If metal option 96 is connected and metal option 98 is not connected a logic high value can be output as Q (POST MO) in response to the rising edge of test enable signal TE. The logic high signal TE in combination with the logic low external reset signal EXT RST causes a logic high pulse of internal reset INT RST. A duration of the pulse is determined by the number of series-connected inverters in single-sided delay 76. The logic high INT RST signal causes the data output Q (POST MO) to change to a logic low. With the metal option providing connection 96 as a closed circuit and connection 98 as an open circuit, modifiable flip-flop 50 provides a logic low Q (POST MO) instead of the stored logic high Q (PRE MO). This allows correction of an unexpected scanned value and provides for partial functionality of the scan chain, unlike the prior art where the entire scan chain is disabled.

Figure 4:
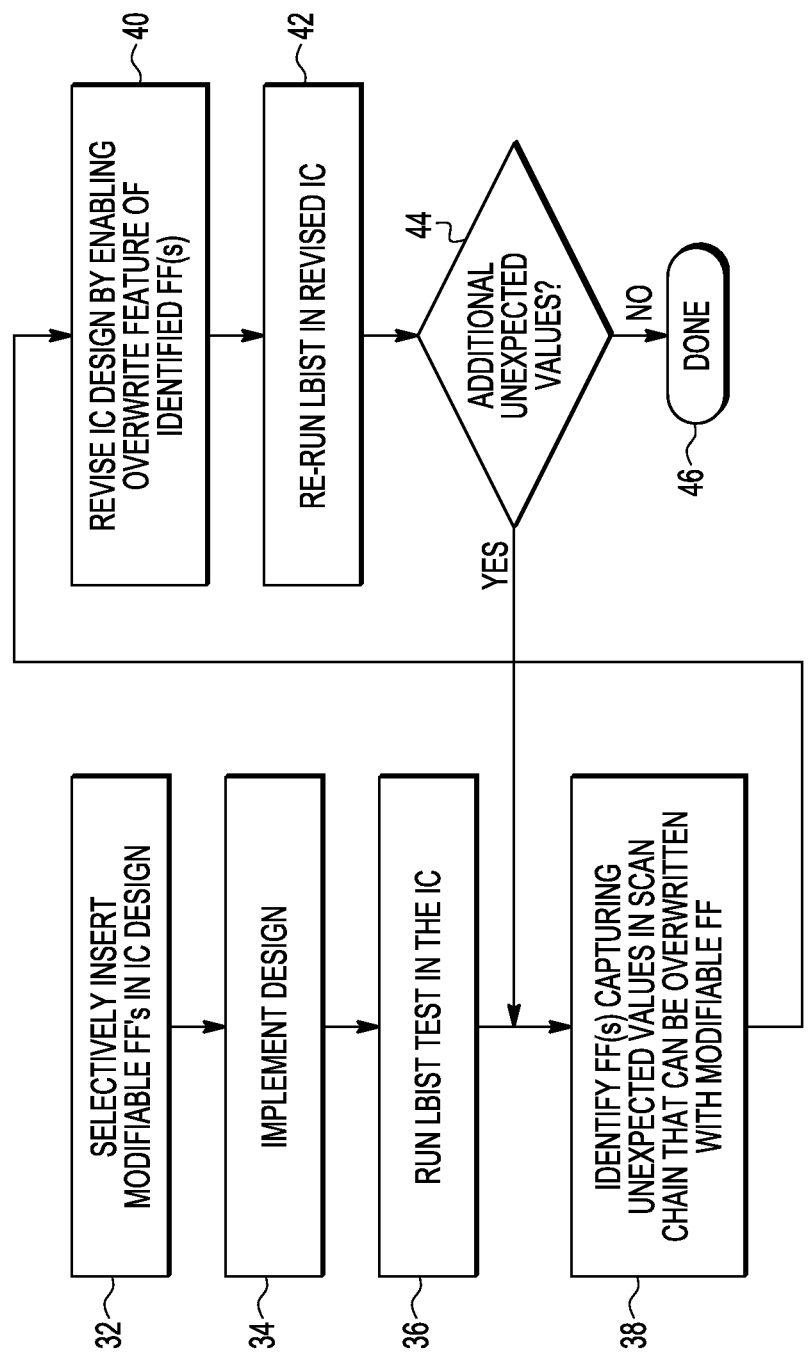
FIG. 4 illustrates a flow chart for a method of using the modifiable flip-flop of FIG. 2 in a scan chain.

FIG. 4 illustrates a flow chart for method 30 for using the modifiable flip-flop 50 of FIG. 2 in a scan chain. At step 32, an integrated circuit is designed with a plurality of modifiable flip-flops 50 that can be connected together in a scan chain for testing using LBIST. At step 34, the design is implemented, or manufactured, using a conventional integrated circuit manufacturing process. At step 36, the LBIST logic is used to test the IC. Failures are indicated by unexpected values in the output data from the scan chain. If failures are detected, at step 38, modifiable flip-flops of the scan chain that are capturing the unexpected values are identified. At step 40, the IC design is revised by enabling the overwrite feature of the identified modifiable flip-flops. The overwrite feature is enabled in the illustrated embodiment by using a metal option in a manufacturing mask set to make connection 96 a closed circuit and connection 98 an open circuit. The revised IC design will output expected values from the scan chain. In some cases, the IC may be revised so that the scan chain outputs stable unexpected values instead of unstable values. In this case the BIST signature, or compare values, may need to be modified so that the scan chain will pass during LBIST. In other embodiments, the overwrite feature might be enabled differently. A new IC is manufactured with the chosen metal option. At step 42, the LBIST is run in the resulting IC that is made from the revised mask set. At decision step 44, it is determined if there are any additional unexpected values. If there are not any additional unexpected values, then the NO path is taken to step 46. At step 46, the method is complete and the LBIST no longer outputs unexpected values. If there are additional unexpected values, the YES path is taken back to step 38 and steps 38, 40, 42, and 44 are repeated until there are not any additional unexpected values.

Figure 5:
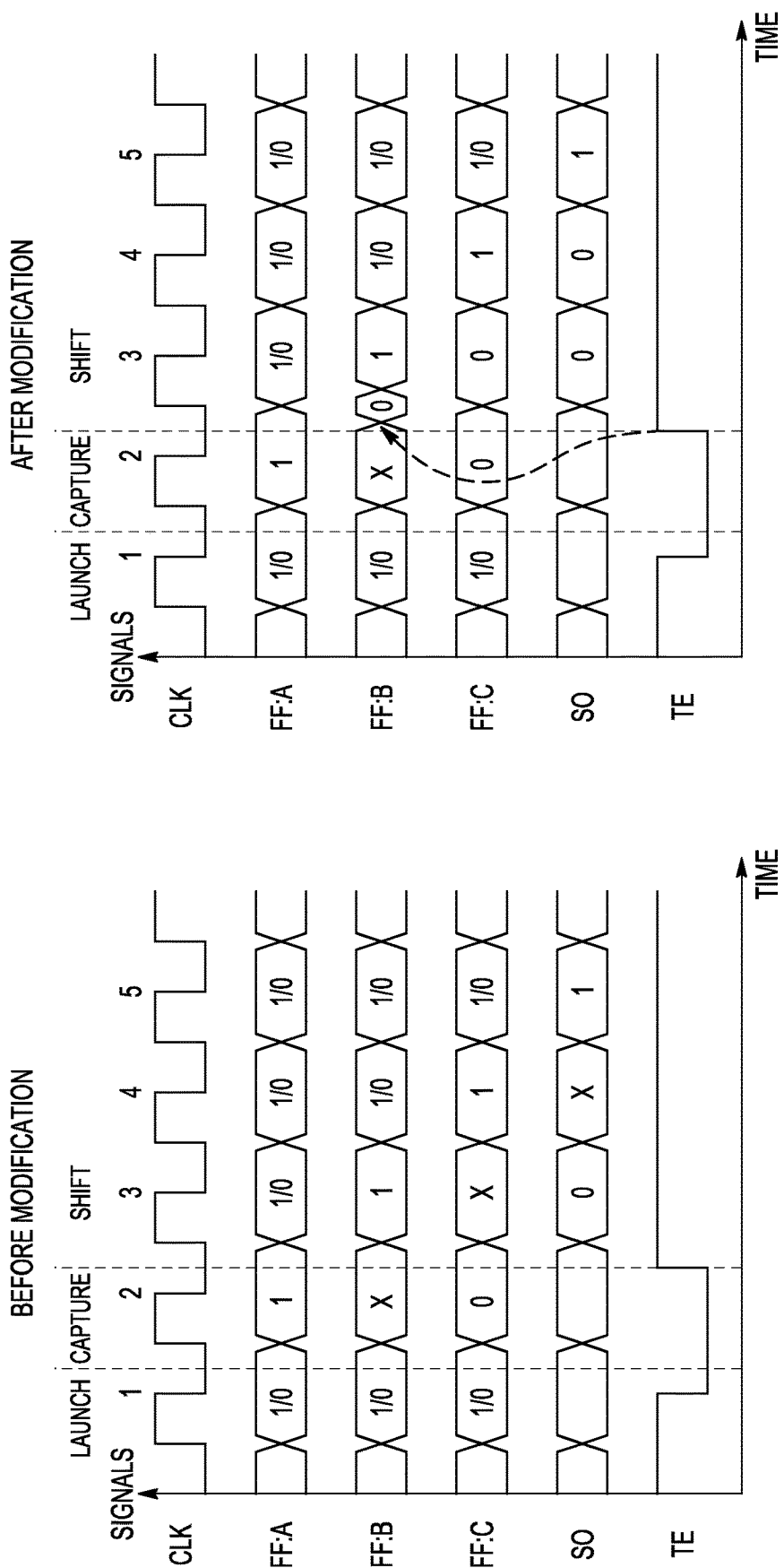
FIG. 5 illustrates a conceptual timing diagram of the operation of a scan chain before modifying the modifiable flip-flop and after modifying the modifiable flip-flop.

FIG. 5 illustrates a conceptual timing diagram of the operation of a scan chain having a plurality of modifiable flip-flops 50 including flip-flops labeled A, B, and C, both before modification and after modification. Before modification, the connection 98 is closed, or connected, as illustrated by the dashed line in FIG. 2 and connection 96 is an open circuit. On the "BEFORE MODIFICATION" side of the timing diagram, at clock cycle 1, the LBIST scan is launched and test enable TE is asserted as a logic high of the LBIST test circuit. The data can be a combination of ones and zeros. At clock cycle 2, data is captured by the flip-flops A, B, and C as shown. The data comprises ones, zeros, and unexpected values that can be either ones or zeros indicated with an "X". The X indicates a one or a zero that was different than expected. Flip-flop B captures an unexpected value X instead of the expected logic zero. A scan-shift operation begins at clock cycle 3 when test enable TE transitions to a logic high. The captured data, including the unexpected value, is shifted out from the scan chain output SO in the order it was captured between clock cycles 3 and 5. The unexpected value causes the IC to fail the LBIST. Note that with respect to the illustrated modifiable flip-flop 50, the output Q will be scan chain output SO for the last flip-flop in the scan chain.

The modification to flip-flop 50 fixes the scan data so that the captured unexpected data is not scanned out, allowing the IC to pass the LBIST. To correct the unexpected value from flip-flip B, the connection 96 is connected, or shorted, (dashed line in FIG. 2) and the connection 98 is an open circuit for only flip-flop B. Flip-flops A and C remain as originally laid out before the modification. The modification may be implemented using a metal option as discussed above. The effect of the correction is illustrated on the right side of FIG. 5. The unexpected value is captured by flip-flop B. But instead outputting the unexpected value, the asserted logic high test enable TE causes the output of flip-flop B to be output as the expected logic zero at the end of scan capture as described above in the description of FIG. 2 and FIG. 3. Following scan capture, all of the captured values, including the inserted corrected value for flip-flop B, is scanned out as illustrated for scan chain output SO.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for operating a scan circuit, the method comprising:
    providing a first scan flip-flop including a reset circuit having an external reset input and an overwrite feature, the overwrite feature comprising a first alternate connection and a second alternate connection;
    capturing a data at a first input of the first scan flip-flop during a first state of a control signal;
    setting the state of the first scan flip-flop to a first logic value based on the captured data;
    enabling the overwrite feature when the first alternate connection is not conductive and the second alternate connection is conductive;
    receiving an external reset indication at the external reset input; and
    while the overwrite feature is enabled and in response to a transition of the control signal from the first state to a second state, providing a pulse at the output of the reset circuit and setting the state of the first scan flip-flop to second logic value using the overwrite feature, the second logic value different from the first logic value.

2. The method of claim 1, further comprising performing a shift operation using a data at a second input of the first scan flip-flop during a second state of the control signal.

3. The method of claim 1, further comprising providing a second scan flip-flop including the overwrite feature, the overwrite feature being disabled.

4. The method of claim 3, further comprising forming a scan chain including one or more of the first scan flip-flop and one or more of the second flip-flop.

5. The method of claim 4, further comprising coupling built-in self-test logic to the scan chain.

6. The method of claim 1, further comprising changing the overwrite feature from disabled to enabled by changing a photomask.

7. The method of claim 1, wherein the control signal is characterized as a test enable signal.

8. A method for operating a scan circuit, the method comprising:
    providing a first scan flip-flop including a reset circuit having an external reset input and an output coupled to the internal reset input of the first scan flip-flop;
    enabling an overwrite feature of the reset circuit by way of a first alternate connection and a second alternate connection;
    capturing a data at a first input of the first scan flip-flop based on a control signal during a capture phase;
    storing the captured data as a first logic value in the first scan flip-flop;
    receiving an external reset indication at the external reset input; and
    while the first alternate connection is not conductive and the second alternate connection is conductive, providing a pulse at the output of the reset circuit and overwriting the stored first logic value in the first scan flip-flop with a second logic value by using the overwrite feature, the pulse based on a transition of the control signal from a first state to a second state during a shift phase, the second logic value different from the first logic value.

9. The method of claim 8, further comprising providing a second scan flip-flop including the overwrite feature, the overwrite feature being disabled.

10. The method of claim 9, further comprising forming a scan chain including the first scan flip-flop and the second scan flip-flop.

11. The method of claim 8, further comprising performing a shift operation using a data at a second input of the first scan flip-flop during a first state of the control signal.

12. The method of claim 8, wherein the overwrite feature is changed from disabled to enabled by changing a single metal layer of an integrated circuit including the overwrite circuit.

13. A scan circuit, comprising:
a first scan flip-flop comprising:
a first master-slave flip-flop having an internal reset input, an input and an output;
a first multiplexer having a first input, a second input, a control input and an output, wherein:
the output of the first multiplexer is coupled to the input of the first master-slave flip flop;
the control input is configured to receive a select signal;
in response to the select signal having a first value, the first multiplexer is configured to receive a first signal value at the first input and provide the first signal value at the output of the first multiplexer; and
in response to the select signal having a second value, the first multiplexer is configured to receive a second signal value at the second input and provide the second signal value at the output of the first multiplexer; and
a reset circuit having an output coupled to the internal reset input of the first master-slave flip-flop, an external reset input, a test enable input configured to receive the select signal, a first alternate connection and a second alternate connection, the reset circuit configured to:
receive an external reset indication at the external reset input;
while the first alternate connection is conductive and the second alternate connection is not conductive, provide the external reset indication at the output of the reset circuit; and
while the first alternate connection is not conductive and the second alternate connection is conductive, in response to a transition of the select signal from the first state to the second state provide a pulse at the output of the reset circuit.

14. The circuit of claim 13, wherein the first alternate connection and the second alternate connection are made conductive using a single photomask.

15. The circuit of claim 13, further comprising:
a second scan flip-flop comprising:
a second master-slave flip-flop having an internal reset input, an input and an output;
a second multiplexer having a first input, a second input, a control input and an output, wherein:
the output of the second multiplexer is coupled to the input of the second master-slave flip flop;
the control input is configured to receive the select signal;
in response to the select signal having the first value, the second multiplexer is configured to receive a first signal value at the first input and provide the first signal value at the output of the second multiplexer; and
in response to the select signal having the second value, the second multiplexer is configured to receive a second signal value at the second input and provide the second signal value at the output of the second multiplexer; and
a second reset circuit having an output coupled to the internal reset input of the second master-slave flip-flop, an external reset input, a test enable input configured to receive the select signal, a third alternate connection and a fourth alternate connection, the second reset circuit configured to:
receive the external reset indication at the external reset input;
while the third alternate connection is conductive and the fourth alternate connection is not conductive, provide the external reset indication at the output of the second reset circuit; and
while the third alternate connection is not conductive and the fourth alternate connection is conductive, in response to a transition of the select signal from the first state to the second state provide a pulse at the output of the second reset circuit;
wherein the first and fourth alternate connections are conductive; and the second and third alternate connections are not conductive.

16. The circuit of claim 15, further comprising built-in self-test logic coupled to the first scan flip-flop and to the second scan flip-flop.

* * * * *